United States Patent
Tomkins

(10) Patent No.: US 10,539,603 B2
(45) Date of Patent: Jan. 21, 2020

(54) SENSITIVE DC CURRENT IMBALANCE DETECTOR AND CALIBRATION METHOD

(71) Applicant: Prime Downhole Manufacturing LLC, Houston, TX (US)

(72) Inventor: Kenneth Tomkins, Farnborough Hampshire (GB)

(73) Assignee: PRIME DOWNHOLE MANUFACTRUING LLC, Houston, TX (US)

( * ) Notice: Subject to any disclaimer, the term of this patent is extended or adjusted under 35 U.S.C. 154(b) by 204 days.

(21) Appl. No.: 15/541,557

(22) PCT Filed: Jan. 8, 2015

(86) PCT No.: PCT/GB2015/050020
§ 371 (c)(1),
(2) Date: Jul. 5, 2017

(87) PCT Pub. No.: WO2016/110661
PCT Pub. Date: Jul. 14, 2016

(65) Prior Publication Data
US 2017/0356949 A1    Dec. 14, 2017

(51) Int. Cl.
*G01R 31/14* (2006.01)
*G01R 31/02* (2006.01)
(Continued)

(52) U.S. Cl.
CPC ........... *G01R 31/025* (2013.01); *G01R 15/18* (2013.01); *G01R 15/202* (2013.01);
(Continued)

(58) Field of Classification Search
CPC ...... G01R 31/025; G01R 27/18; G01R 31/40; G01R 31/024; G01R 31/42; G01R 31/006; G01R 31/008
(Continued)

(56) References Cited

U.S. PATENT DOCUMENTS 6,011,398 A * 1/2000 Bald .................... G01R 31/025
324/508
6,043,662 A * 3/2000 Alers ................. G01R 31/2626
324/520

(Continued)

FOREIGN PATENT DOCUMENTS

DE           25 55 255 A1    6/1977
DE    10 2010 002 060 A1    8/2011
(Continued)

OTHER PUBLICATIONS

DE 2555255 machine translation, Jun. 16, 1977 (Year: 1977).*
(Continued)

*Primary Examiner* — Raul J Rios Russo
(74) *Attorney, Agent, or Firm* — King & Spalding LLP

(57) ABSTRACT

A current leakage detector for detecting current leakage between a power source and a load including a first sensing coil and a second sensing coil positioned opposite the first sensing coil. The current leakage detector further includes a magnetic field sensor proximate the first sensing coil and the second sensing coil and the magnetic field sensor has a response range. The current leakage detector also includes a bias circuit configured to adjust the response range of the magnetic field sensor. A method for detecting current leakage includes providing a first sensing coil and a second sensing coil. The method continues with the steps of providing a magnetic field sensor in proximity to the first and second sensing coils and providing a bias circuit. The method continues with the step of utilizing the bias circuit to place the response of the magnetic field sensor within a preferred response range.

13 Claims, 3 Drawing Sheets

(51) Int. Cl.
- *G01R 27/18* (2006.01)
- *G01R 31/42* (2006.01)
- *G01R 31/00* (2006.01)
- *G01R 15/20* (2006.01)
- *H02H 3/33* (2006.01)
- *G01R 15/18* (2006.01)
- *G01R 31/40* (2014.01)
- *H02H 1/00* (2006.01)

(52) U.S. Cl.
CPC .......... *G01R 15/205* (2013.01); *G01R 27/18* (2013.01); *G01R 31/006* (2013.01); *G01R 31/008* (2013.01); *G01R 31/024* (2013.01); *G01R 31/42* (2013.01); *H02H 3/33* (2013.01); *G01R 15/185* (2013.01); *G01R 31/40* (2013.01); *H02H 1/003* (2013.01)

(58) Field of Classification Search
USPC ................ 324/500, 508, 509, 541, 544, 551
See application file for complete search history.

(56) References Cited

U.S. PATENT DOCUMENTS

| | | | | |
|---|---|---|---|---|
| 6,144,197 A | * | 11/2000 | Shimamura | G01D 5/147 324/166 |
| 2003/0151406 A1 | * | 8/2003 | Wan | G01R 15/205 324/252 |
| 2004/0080316 A1 | * | 4/2004 | Friend | G01C 17/30 324/244 |
| 2007/0262779 A1 | | 11/2007 | Kirk | |
| 2012/0112757 A1 | | 5/2012 | Vrankovic et al. | |
| 2014/0062471 A1 | * | 3/2014 | Deak | G01R 21/06 324/252 |

FOREIGN PATENT DOCUMENTS

| | | |
|---|---|---|
| EP | 0 157 054 A1 | 10/1985 |
| GB | 2 181 599 A | 4/1987 |
| WO | 2011/101236 A1 | 8/2011 |

OTHER PUBLICATIONS

International Search Report and Written Opinion issued in connection with corresponding PCT Application No. PCT/GB2015/050020 dated Sep. 11, 2015.

International Preliminary Report on Patentability issued in connection with corresponding PCT Application No. PCT/GB2015/050020 dated Jul. 11, 2017.

* cited by examiner

SENSITIVE DC CURRENT IMBALANCE DETECTOR AND CALIBRATION METHOD

FIELD OF THE INVENTION

This invention relates generally to the field of electric devices and more particularly, but not by way of limitation, to a current leak detector and method of calibration.

BACKGROUND

In many conventional electric circuits, electric current flows from a power source to a load and back to the power source. The intended current path is typically achieved through use of insulated conductors and electrical components. If the insulation fails or the circuit is otherwise compromised, electric current may "leak" into unintended areas of the device. Leakage current is current that escapes the intended circuit path and returns to the power supply through an unintended route.

Leakage current may travel from the circuit into a conductive housing or panel. If the housing or panel is properly grounded, the leakage current is diverted to ground. In some instances, however, the housing or panel may not be grounded or the ground may be insufficient to safely carry the leakage current. In these cases, anyone coming into contact with the housing or panel may be exposed to an electric shock.

Prior art DC current leakage detectors tend to be difficult to calibrate and lack sensitivity. The deficiencies of the prior art current leakage detectors expose operators of electrical equipment to potential harm. There is, therefore, a need for an improved current leakage detector that can either alert an operator of a current leakage event or remove the power (or both) before the operator comes into contact with the hazardous equipment.

SUMMARY OF THE INVENTION

In present embodiments, a current leakage detector is configured for detecting current leakage between a power source and a load. The current leakage detector includes a first sensing coil and a second sensing coil arranged in opposition to the first sensing coil. The current leakage detector further includes a magnetic field sensor proximate the first sensing coil and the second sensing coil and the magnetic field sensor has a response range. The current leakage detector also includes a bias circuit configured to adjust the response range of the magnetic field sensor.

In another aspect, embodiments include an electrically powered device that includes a power supply, a load and a current leakage detector for detecting current leakage between the power supply and the load. The current leakage detector includes a first sensing coil and a second sensing coil arranged in opposition to the first sensing coil. The current leakage detector further includes a magnetic field sensor proximate the first sensing coil and the second sensing coil, and the magnetic field sensor has a response range. The current leakage detector also includes a bias circuit configured to adjust the response range of the magnetic field sensor.

In yet another aspect, embodiments include a method for detecting current leakage between a power source and a load connected to the power source. The method includes the steps of providing a first sensing coil between the power source and the load and providing a second sensing coil arranged in opposition to the first sensing coil between the load and the power source. The method continues with the steps of providing a magnetic field sensor in proximity to the first and second sensing coils and providing a bias circuit. The method continues with the step of utilizing the bias circuit to place the response of the magnetic field sensor within a response range.

DETAILED DESCRIPTION

Figure 1:
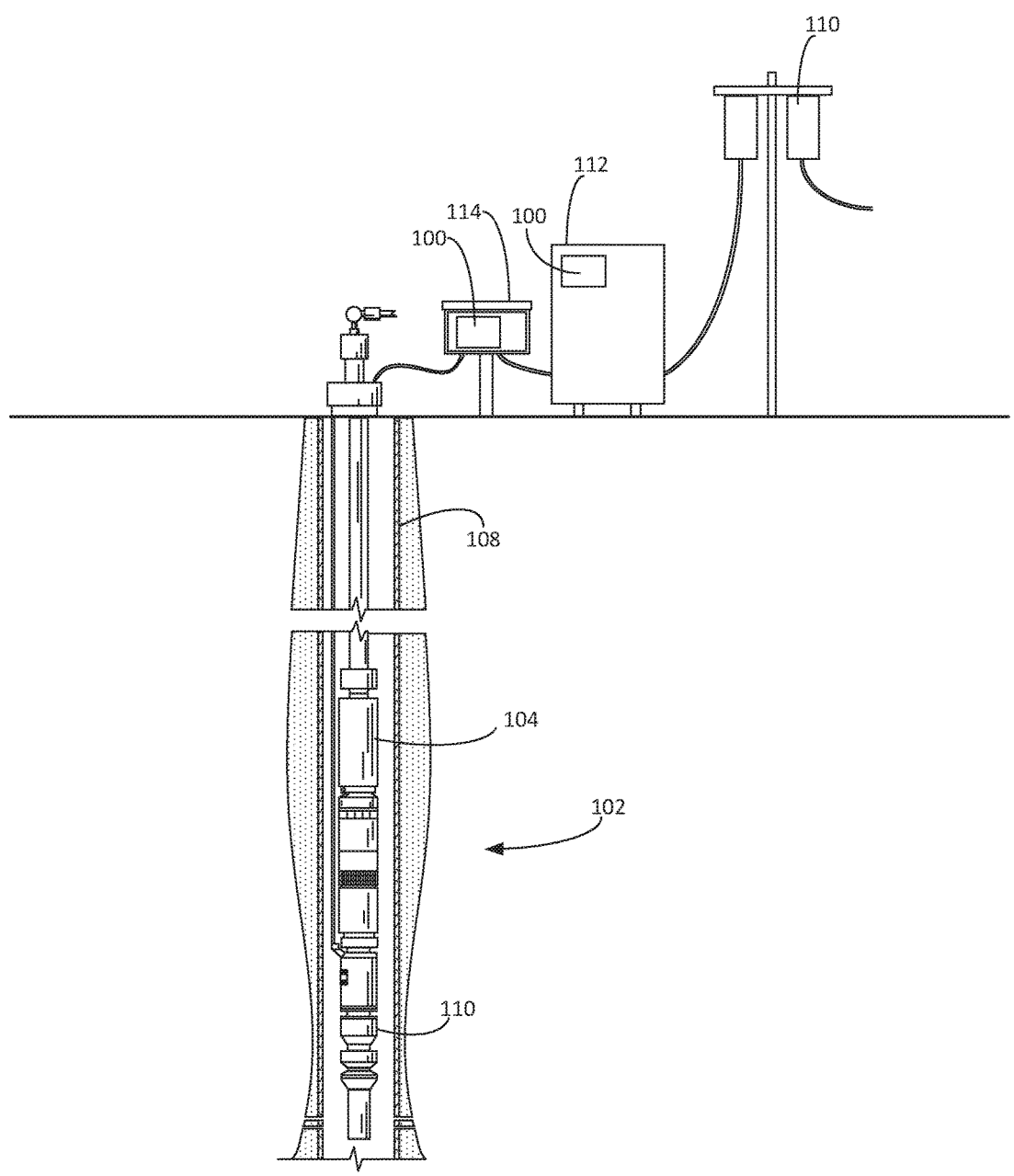
FIG. 1 is a depiction of a current leakage detector constructed and installed within an electric submersible pumping system.

In accordance with an embodiment of the present invention, FIG. 1 shows a depiction of current leakage detectors 100 incorporated within a pumping system 102. It will be appreciated that the current leakage detector 100 can be incorporated within any electric equipment and that the discussion of the incorporation of the current leakage detector 100 within the pumping system 102 is merely an application for the current leakage detector 100.

The pumping system 102 includes a submersible pump 104 driven by an electric motor 106. When energized, the motor 106 moves the pump 104, which forces fluids in the wellbore 108 to the surface. The motor 106 is provided with electric power from a surface-mounted power supply 110. The power supply 110 may include electric generators and connections to a power grid. The pumping system 102 further includes a motor drive 112 and transformer 114 that condition and control the power provided to the motor 106. In this way, the operational characteristics of the motor 106 can be controlled and affected by the motor drive 112, transformer 114 and power supply 110. Although the pumping system 102 is depicted as a submersible system used to recover fluids from an underground reservoir, it will be appreciated that the pumping system 102 might also include a surface pumping system that moves fluids between surface facilities.

A first current leakage detector 100 is, in an embodiment, incorporated within the motor drive 112 (as shown in FIG. 1) and used to monitor current passed to the transformer 114. A second current leak detector 100 can be placed within the transformer 114 and used to monitor current passed to the motor 106. Each current leakage detector 100 is configured to monitor the electric current passing into and out of a load. In the exemplary embodiment depicted in FIG. 1, the load is either the transformer 114 or the electric motor 106. It will be appreciated that the load observed by the current leakage detector 100 could be any electric load that draws current from a power source. It will be further appreciated that additional or fewer current leakage detectors 100 may be used in embodiments.

Figure 2:
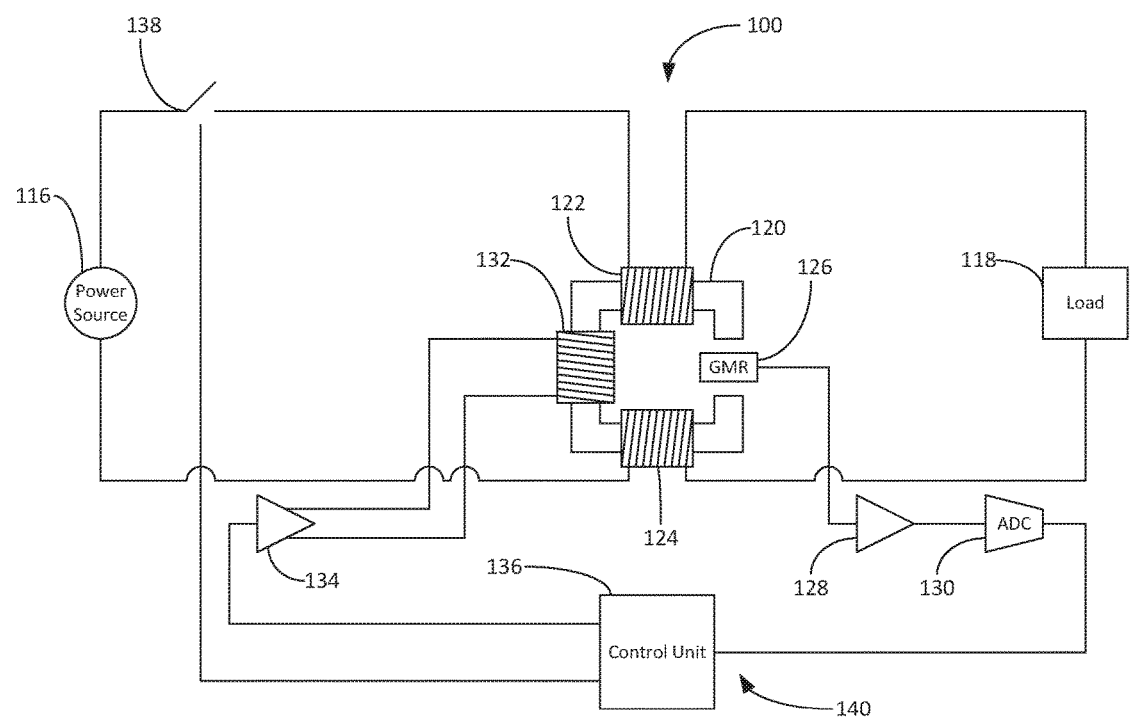
FIG. 2 is a circuit diagram of the current leakage detector of FIG. 1.

Turning to FIG. 2, shown therein is a circuit diagram of an embodiment of the current leakage detector 100. In embodiments, the current leakage detector 100 includes a power source 116, a load 118, a coil core 120, a first sensing coil 122, a second sensing coil 124, a giant magneto-restrictive (GMR) sensor 126, a sensor amplifier 128, a sensor analog-to-digital converter (ADC) 130, a bias coil 132, a bias coil driver 134, a control unit 136 and a switch 138. In the exemplary application of the current leakage detector 100 in FIG. 1, the load 118 is the motor 106 and the transformer 114. The power source 116 is used to provide power to the load 118 when the switch 138 is closed. The power source 116 is also in an embodiment configured to directly or indirectly provide power to the control unit 136, bias coil driver 134, sensor amplifier 128 and sensor ADC.

Current is directed to the load 118 from the power source 116 through the first sensing coil 122. Current returns from the load 118 to the power source 116 through the second sensing coil 124. The first and second sensing coils 122, 124 are each wound around opposing sides of the coil core 120. In an embodiment, the coil core 120 is formed as a unitary soft ferromagnetic core having a "block C" shape. The first and second sensing coils 122, 124 have substantially the same number of turns and are wound in opposition on the core, but not necessarily on opposing legs of the coil core 120 so that the net magnetic coercive force produced by first and second sensing coils 122, 124 is substantially eliminated when current passing through the first and second sensing coils 122, 124 is the same.

If leakage current exists between the load 118 and the first and second sensing coils 122, 124, the current passing through the first and second sensing coils 122, 124 will not be equal and the coercive magnetic force generated by the first and second sensing coils 122, 124 will not be canceled. The GMR sensor 126 is magnetically coupled to the first and second sensing coils 122, 124 and is configured to output an analog signal in response to the magnetic field generated by the presence of the coercive magnetic force generated by the current imbalance in the first and second sensing coils 122, 124.

The magnetic field generated by the coercive magnetic force generated by the first and second sensing coils 122, 124 and the response signal generated by the GMR sensor 126 are both grossly nonlinear. If the coercive magnetic force generated by the first and second sensing coils 122, 124 is small, the GMR sensor 126 may not produce a representative output signal. The signal may be disproportionately small and may be characterized by an incorrect polarity.

To improve the response of the GMR sensor 126, the current leakage detector 100 utilizes the bias coil 132 to provide a baseline magnetic field at the GMR sensor 126. The bias coil 132 selectively applies a bias magnetic field that moves the response provided by the GMR sensor 126 into a more predictable and useful range. From the biased baseline range, the GMR sensor 126 can more accurately and robustly signal a field imbalance between the first and second sensing coils 122, 124. To place the response of the GMR sensor 126 within the biased baseline range, the current leakage detector 100 includes a bias circuit 140. The bias circuit 140 can be characterized as the collection of the GMR sensor 126, the sensor amplifier 128, the sensor ADC 130, the bias coil 132, the bias coil driver 134, and the control unit 136.

Generally, the control unit 136 provides a control signal to the bias coil driver 134. The bias coil driver 134 then applies a responsive drive current to the bias coil 132. The bias coil 132 then produces a bias magnetic field that is picked up by the GMR sensor 126. The GMR sensor 126 produces a signal that is representative of the bias magnetic field. The signal output by the GMR sensor 126 is provided to the sensor amplifier 128 and then to the sensor ADC 130. The digitized signal is then passed back to the control unit 136 to complete the bias circuit 140 loop.

Figure 3:
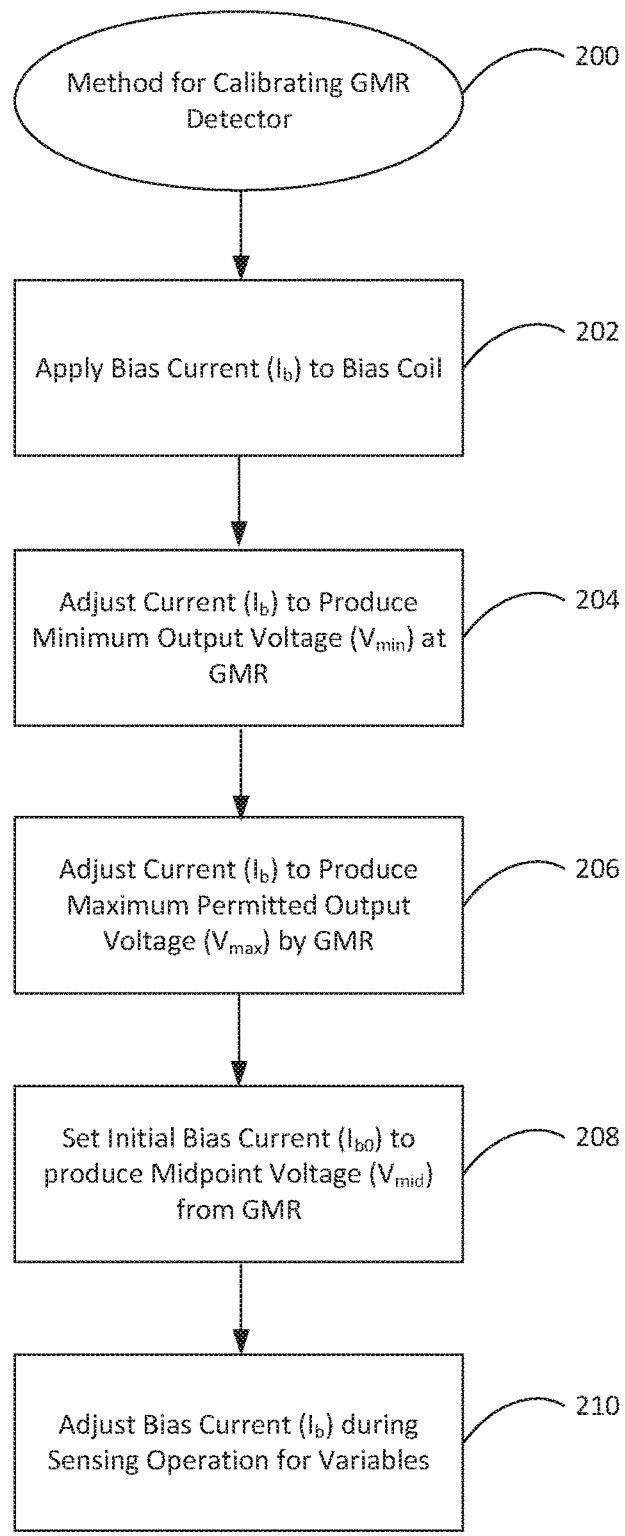
FIG. 3 is a process flow diagram for a method of calibrating the current leakage detector of FIG. 1

In embodiments, the bias circuit 140 is used to calibrate the GMR sensor 126 within a selected biased baseline range using algorithms implemented by the control unit 136. An embodiment of a method 200 of calibrating the current leakage detector 100 is depicted in FIG. 3. The method begins at step 202 when the control unit 136 instructs the bias coil driver 134 to send a bias current ($I_b$) to the bias coil 132. The magnetic field produced by the magnetic coercive force generated by the bias coil 132 is recognized by the GMR sensor 126 and registered by the control unit 136. At step 204, the bias current ($I_b$) is adjusted to the level at which the GMR sensor 126 outputs a minimum signal ($V_{min}$). The minimum voltage output by the GMR sensor 126 is recorded by the control unit 136.

At step 206, the control unit 136 adjusts the current supplied to the bias coil 132 to an extent that produces the maximum voltage ($V_{max}$) output by the GMR sensor 126 that can be accepted by the sensor amplifier 128. The maximum voltage output by the GMR sensor 126 is recorded by the control unit 136. Next, at step 208, the control unit 136 sets an initial bias current ($I_{b0}$) at the value that produces a voltage at the GMR sensor 126 that is approximately at the median value ($V_{mid}$) between the minimum voltage ($V_{min}$) and maximum voltage ($V_{max}$) recorded by the control unit 136. Because of the combined nonlinearities in the response of the bias coil 132 and GMR sensor 126, the initial bias current ($I_{b0}$) that produces a midpoint voltage ($V_{mid}$) at the GMR sensor 126 may not represent a median value between the bias currents used to produce the minimum ($V_{min}$) and maximum ($V_{max}$) voltages at the GMR sensor 126.

The method 200 of calibrating the current leakage detector 100 is in an embodiment carried out before the power source 116 is connected to the load 118. Once the current leakage detector 100 is placed in operation, the GMR sensor 126 can be continuously or periodically recalibrated at step 210 to account for changes in the system. Such changes may include, for example, changes in the load 118 and temperatures changes at the first and second sensing coils. Recalibration can be carried out by adjusting the bias current ($I_b$) supplied to the bias coil 132 to find the median voltage ($V_{mid}$) output by the GMR sensor 126.

In operation and after the initial bias current ($I_{b0}$) has been determined, the switch 138 can be closed to direct current from the power source 116 to the load 118 through the first and second sensing coils 122, 124. The bias coil 132 applies the initial bias magnetic field to place the response of the GMR sensor 126 within the desired range so that any imbalances between the first and second sensing coils 122, 124 is more accurately detected by the GMR sensor 126 and reported by the control unit 136. In embodiments, the control unit 136 triggers an alarm or notification if a leakage current condition is detected. The control unit 136 can also be configured to open the switch 138 or otherwise disconnect the power source 116 in the event a leakage current condition is detected.

It is to be understood that even though numerous characteristics and advantages of various embodiments of the present invention have been set forth in the foregoing description, together with details of the structure and functions of various embodiments of the invention, this disclosure is illustrative only, and changes may be made in detail, especially in matters of structure and arrangement of parts within the principles of embodiments of the present invention to the full extent indicated by the broad general meaning of the terms in which the appended claims are expressed. It will be appreciated by those skilled in the art that the teachings of the present invention can be applied to other systems without departing from the scope and spirit of the present invention.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for detecting current leakage between a power source and a load connected to the power source, the method comprising the steps of:
    providing a first sensing coil between the power source and the load;
    providing a second sensing coil in an opposing position to the first sensing coil between the load and the power source;
    providing a magnetic field sensor in proximity to the first and second sensing coils;
    providing a bias circuit; and
    utilizing the bias circuit to place the response of the magnetic field sensor within a preferred response range,
    wherein the step of providing a bias circuit further comprises:
        providing a bias coil;
        providing a bias coil driver to drive the bias coil; and
        providing a control unit to control the operation of the bias coil, and
    wherein the step of utilizing the bias circuit further comprises the steps of:
        measuring the magnetic field produced by the bias coil with the magnetic field sensor;
        adjusting the current applied to the bias coil to find the minimum voltage output by the magnetic field sensor;
        adjusting the current applied to the bias coil to find the maximum voltage output by the magnetic field sensor; and
        adjusting the current applied to the bias coil to a point at which the voltage produced by the magnetic field sensor is a median value between the minimum voltage output by the magnetic field sensor and the maximum voltage output by the magnetic field sensor.

2. The method of claim 1, wherein the step of utilizing the bias circuit further comprises applying an initial bias current to the bias coil before the power source is connected to the load.

3. The method of claim 1, further comprising the step of identifying a current leakage condition.

4. The method of claim 3, wherein the step of identifying a current leakage condition comprises identifying a magnetic field imbalance between the first and second sensing coils.

5. The method of claim 3, wherein the method further comprises the step of providing an alert when a current leakage condition is detected.

6. The method of claim 3, wherein the method further comprises the step of automatically disconnecting the power source from the load in response to the detection of a current leakage condition.

7. The method of claim 1, further comprising the step of identifying a current leakage condition after the step of utilizing the bias circuit to place the response of the magnetic field sensor within a preferred response range.

8. A method for detecting current leakage between a power source and a load connected to the power source, the method comprising the steps of:
    providing a first sensing coil between the power source and the load;
    providing a second sensing coil in an opposing position to the first sensing coil between the load and the power source;
    providing a magnetic field sensor in proximity to the first and second sensing coils;
    providing a bias circuit; and
    utilizing the bias circuit to place the response of the magnetic field sensor within a preferred response range,
    wherein the step of providing a bias circuit further comprises:
        providing a bias coil;
        providing a bias coil driver to drive the bias coil; and
        providing a control unit to control the operation of the bias coil, and
    wherein the step of utilizing the bias circuit further comprises the steps of:
        measuring the magnetic field produced by the bias coil with the magnetic field sensor;
        adjusting the current applied to the bias coil to find the minimum voltage output by the magnetic field sensor;
        adjusting the current applied to the bias coil to find the maximum voltage output by the magnetic field sensor;
        adjusting the current applied to the bias coil to a point at which the voltage produced by the magnetic field sensor is a median value between the minimum voltage output by the magnetic field sensor and the maximum voltage output by the magnetic field sensor; and
        applying an initial bias current to the bias coil before the power source is connected to the load.

9. The method of claim 8, further comprising the step of identifying a current leakage condition.

10. The method of claim 9, wherein the step of identifying a current leakage condition comprises identifying a magnetic field imbalance between the first and second sensing coils.

11. The method of claim 9, wherein the method further comprises the step of providing an alert when a current leakage condition is detected.

12. The method of claim 9, wherein the method further comprises the step of automatically disconnecting the power source from the load in response to the detection of a current leakage condition.

13. The method of claim 8, further comprising the step of identifying a current leakage condition after the step of utilizing the bias circuit to place the response of the magnetic field sensor within a preferred response range.

* * * * *